US012631492B2

(12) United States Patent
Ohta et al.

(10) Patent No.: US 12,631,492 B2
(45) Date of Patent: May 19, 2026

(54) ELECTROMAGNETIC WAVE SENSOR AND MANUFACTURING METHOD THEREOF

(71) Applicant: TDK Corporation, Tokyo (JP)

(72) Inventors: Naoki Ohta, Tokyo (JP); Shinji Hara, Tokyo (JP); Susumu Aoki, Tokyo (JP); Maiko Kokubo, Tokyo (JP); Kazuya Maekawa, Tokyo (JP); Tadao Senriuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 518 days.

(21) Appl. No.: 18/180,297

(22) Filed: Mar. 8, 2023

(65) Prior Publication Data

US 2023/0296443 A1    Sep. 21, 2023

(30) Foreign Application Priority Data

Mar. 16, 2022    (JP) ................................. 2022-041612
Jan. 13, 2023    (JP) ................................. 2023-003743

(51) Int. Cl.
  *G01J 5/20*        (2006.01)
  *H10F 39/18*       (2025.01)

(52) U.S. Cl.
  CPC ........... *G01J 5/20* (2013.01); *G01J 2005/202* (2013.01); *H10F 39/184* (2025.01)

(58) Field of Classification Search
  CPC ........ G01J 5/20; G01J 2005/202; G01J 5/026; G01J 5/045; H10F 39/184
  See application file for complete search history.

(56) References Cited

U.S. PATENT DOCUMENTS

| | | | |
|---|---|---|---|
| 2011/0061449 A1* | 3/2011 | Yagi ........................... | G01J 5/04 |
| | | | 250/338.1 |
| 2013/0106868 A1* | 5/2013 | Shenoy ............... | B81C 1/00269 |
| | | | 174/521 |
| 2016/0097681 A1* | 4/2016 | Buchan ................. | G01J 5/0813 |
| | | | 250/338.4 |
| 2020/0408604 A1 | 12/2020 | Ohta et al. | |

FOREIGN PATENT DOCUMENTS

WO        2019/171488 A1    9/2019

OTHER PUBLICATIONS

"Plating Process in Semiconductor Manufacturing: A Detailed Overview" (Year: 2025).*

* cited by examiner

*Primary Examiner* — Randy W Gibson
(74) *Attorney, Agent, or Firm* — Posz Law Group, PLC

(57)        ABSTRACT

Electromagnetic wave sensor (infrared sensor) has a first substrate; a second substrate that faces the first substrate and that allows infrared rays to pass through at least a part of the second substrate; first circumferential wall that is positioned between the first substrate and the second substrate and that forms first space together with the first and second substrates; bolometer structures that are provided in first space; first measuring element that is provided in first space and that is used for taking a first measurement relating to pressure in first space; and a monitoring portion. The monitoring portion acquires the first measurement that is taken using first measuring element and outputs a predetermined signal indicating an abnormality based on at least the first measurement.

19 Claims, 5 Drawing Sheets

Fig. 1A
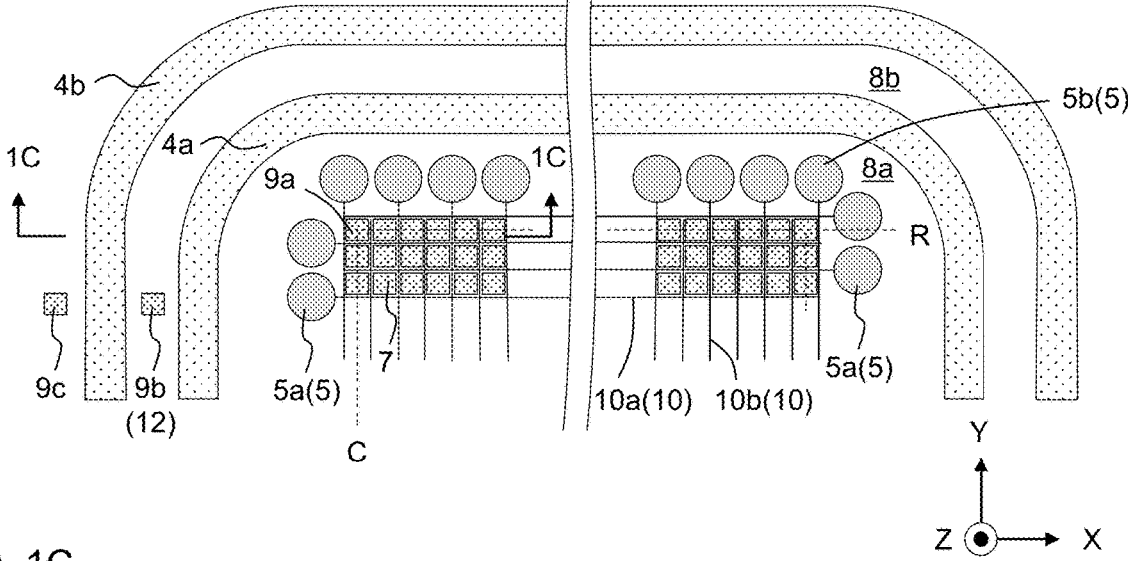
Fig. 1B
Fig. 1C
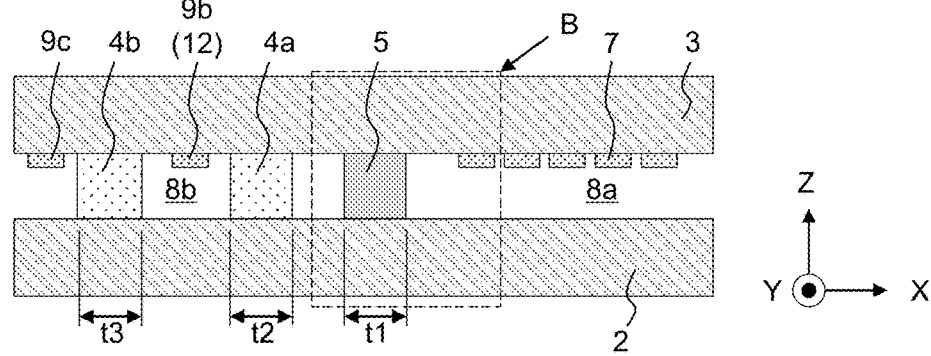

Normal condition

P3

P1, P2

Time

Abnormal mode 1: Abnormality of second circumferential wall

P3

P2

P1

Time

Abnormal mode 2: Abnormality of first and second circumferential walls

P3

P2

P1

Time

Abnormal mode 3: Abnormality of first space

P3

P1

P2

Time

ELECTROMAGNETIC WAVE SENSOR AND MANUFACTURING METHOD THEREOF

FIELD OF THE DISCLOSURE

The present application is based on and claims priority from JP2022-041612 filed on Mar. 16, 2022 and JP2023-003743 filed on Jan. 13, 2023, the disclosures of which are hereby incorporated by reference herein in their entirety.

The present disclosure relates to an electromagnetic wave sensor and a manufacturing method thereof, and particularly to an infrared sensor having a bolometer structure.

DESCRIPTIONS OF THE RELATED ART

An infrared sensor is known that has a bolometer structure and that detects the temperature distribution of an object in the infrared wavelength range. Such an infrared sensor allows infrared rays to be incident from outside to the bolometer structure and to be absorbed by the bolometer structure, thereby causing a change in the temperature of the bolometer structure, and outputs the change in temperature of the bolometer structure as a change in electric resistance. There is a correlation between the temperature of an object and the irradiance (radiant energy) that is emitted from the object (the Stefan-Boltzmann law). Accordingly, the temperature distribution of the object can be measured by detecting the change in temperature of the bolometer structure that is caused by radiant heat radiated from the object. The bolometer structure is housed in a closed vacuum container in order to precisely detect the radiant heat. WO2019/171488 discloses an electromagnetic wave sensor having a vacuum container that is formed of two substrates and a circumferential wall.

SUMMARY

Because a vacuum container that houses a bolometer structure is typically formed by bonding members, the sealing performance of joints may deteriorate due to such factors as aging. Deterioration of sealing performance causes degradation of the degree of vacuum or loss of vacuum of the vacuum container and leads to deterioration of the performance or loss of the function of the electromagnetic wave sensor.

It is desirable to provide an electromagnetic wave sensor that can detect deterioration of sealing performance.

According to an aspect of the present invention, an electromagnetic wave sensor comprises: a first substrate; a second substrate that faces the first substrate and that allows infrared rays to pass through at least a part of the second substrate; a first circumferential wall that is positioned between the first substrate and the second substrate and that forms a first space together with the first and second substrates; bolometer structures that are provided in the first space; a first measuring element that is provided in the first space and that is used for taking a first measurement relating to pressure P1 in the first space; and a monitoring portion. The monitoring portion acquires the first measurement that is taken using the first measuring element and outputs a predetermined signal indicating an abnormality based on at least the first measurement.

Another aspect of the present invention relates to a method for manufacturing an electromagnetic wave sensor. The electromagnetic wave sensor comprises: a first substrate; a second substrate that faces the first substrate and that allows infrared rays to pass through at least a part of the second substrate; a first circumferential wall that is positioned between the first substrate and the second substrate and that forms a first space together with the first and second substrates; bolometer structures that are provided in the first space; and an electric connection member that connects the first substrate to the second substrate. The method comprises simultaneously forming the electric connection member and the first circumferential wall by plating.

According to the present disclosure, it is possible to provide an electromagnetic wave sensor that can detect deterioration of the sealing performance.

The above and other objects, features and advantages of the present disclosure will become apparent from the following descriptions with reference to the accompanying drawings that illustrate examples of the present disclosure.

BRIEF DESCRIPTIONS OF THE DRAWINGS

FIG. 1A is a conceptual view of an infrared sensor according to an embodiment of the present disclosure;

FIG. 1B is an enlarged view of portion A in FIG. 1A;

FIG. 1C is a cross-sectional view taken along line 1C-1C in FIG. 1B;

DESCRIPTIONS OF EMBODIMENTS

With reference to the drawings, an embodiment of the electromagnetic wave sensor of the present disclosure will now be described. In the following descriptions and drawings, first direction X and second direction Y are parallel to the main surfaces of first substrate 2 and second substrate 3, first direction X corresponds to rows of the array of the bolometer structures and second direction Y corresponds to columns of the array of the bolometer structures. First direction X and second direction Y are perpendicular to each other. Third direction Z is perpendicular both to first direction X and to second direction Y and is perpendicular to the main surfaces of first substrate 2 and second substrate 3.

The following embodiment is directed to an infrared sensor in which bolometer structures are arranged in a two-dimensional array. Such an infrared sensor is mainly used as an image sensor of an infrared camera. An infrared camera may be used for a night vision scope or night vision goggles in the dark and may also be used to measure the temperature of a human subject or an object. Recently, infrared cameras have also come to be used as a part of a sensor system of an automobile. Furthermore, an infrared sensor in which bolometer structures are arranged in one dimension may be used as a sensor that measures various kinds of temperatures or temperature distributions. Although not described here, an infrared sensor in which bolometer structures are arranged in one dimension is also included in the scope of the present invention. In addition, electromagnetic waves that are detected are not limited to infrared rays, and an electromagnetic wave sensor of the present invention may also detect, for example, terahertz waves having wavelengths of 100 μm to 1 mm.

General Arrangement

Figure 2:
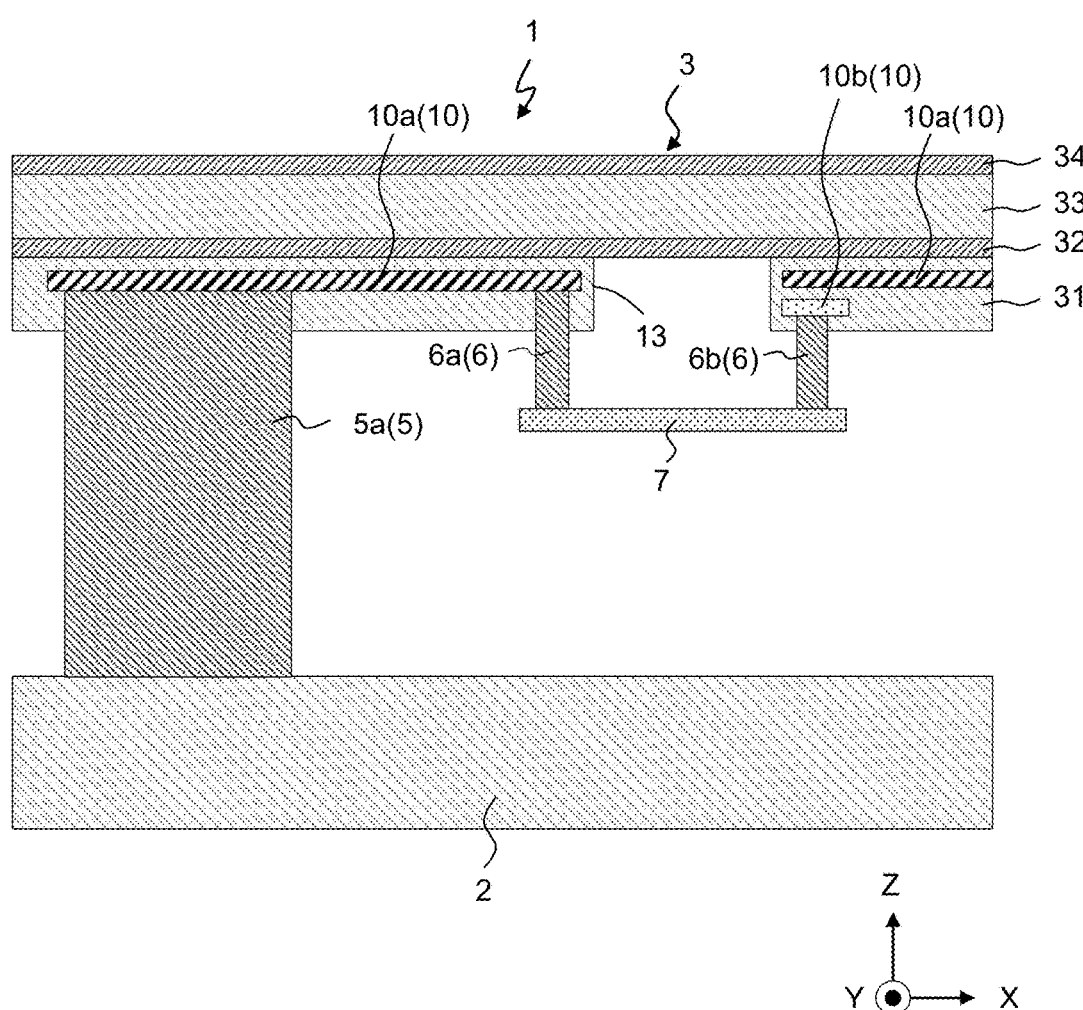
FIG. 2 is a partial cross-sectional view of the infrared sensor shown in FIGS. 1A to 1C.

FIG. 1A is a conceptual plan view of infrared sensor 1 according to an embodiment of the present disclosure, FIG. 1B is an enlarged view of portion A in FIG. 1A, FIG. 1C is a cross-sectional view taken along line 1C-1C in FIG. 1B, and FIG. 2 is an enlarged view of portion B in FIG. 1C. Infrared sensor 1 includes first substrate 2, second substrate 3 that faces first substrate 2, and first and second circumferential walls 4a and 4b that are positioned between first substrate 2 and second substrate 3. First circumferential wall 4a and second circumferential wall 4b are formed of metal such as permalloy or nickel. First circumferential wall 4a forms, together with first and second substrates 2 and 3, first space 8a in which bolometer structures 7 are provided. Second circumferential wall 4b surrounds first circumferential wall 4a outside first circumferential wall 4a and forms second space 8b together with first and second substrates 2 and 3 and first circumferential wall 4a. First space 8a and second space 8b are closed spaces that are kept at a negative pressure or a vacuum in a normal condition. Thus, convection of gases in first space 8a is prevented or limited and thermal influence on bolometer structures 7 can be mitigated. The pressure (first pressure P1) or the degree of vacuum in first space 8a and the pressure (second pressure P2) or the degree of vacuum in second space 8b are substantially the same. In a normal condition, first pressure P1 and second pressure P2 are lower than the pressure outside second space 8b (third pressure P3).

First substrate 2 includes a silicon substrate and an insulating film (neither is shown in the figure). A read-out integrated circuit (ROIC) having components such as a regulator, an A/D converter and a multiplexer is formed along with various elements and wiring (not illustrated) on the surface of the silicon substrate or in the insulating film. Second substrate 3 includes insulating layer 31 that covers leads 10 (to be described later), anti-reflective film 32 that is adjacent to insulating layer 31, silicon substrate 33 that is adjacent to anti-reflective film 32, and anti-reflective film 34 that is adjacent to silicon substrate 33. Insulating layer 31 is formed of aluminum nitride, silicon nitride, aluminum oxide, silicon dioxide, magnesium oxide, or the like. Silicon substrate 33 and anti-reflective films 32 and 34 allow long wavelength infrared rays to pass therethrough. Insulating layer 31 is less apt to allow long wavelength infrared rays to pass therethrough than silicon substrate 33 and anti-reflective films 32 and 34 and therefore has through hole 13 that faces bolometer structure 7 in third direction Z. Through hole 13 functions as a light-incident portion that allows long wavelength infrared rays to be incident to first space 8a. Accordingly, second substrate 3 allows long wavelength infrared rays to pass through at least a part of second substrate 3. The wavelengths of long wavelength infrared rays are about 8 to 14 μm.

Bolometer structures 7 are provided in first space 8a. Each bolometer structure has a substantially square shape. Bolometer structures 7 form a two-dimensional lattice array that consists of rows R arranged at a constant interval in first direction X and columns C arranged at a constant interval in second direction Y. Each bolometer structure 7 forms one cell or pixel of this array. The number of rows and columns of the array is, for example, but not limited to, 640 rows×480 columns or 1024 rows×768 columns. In the present embodiment, bolometer structure 7 includes a thermistor film that outputs a change in temperature as a change in electric resistance, a radiant heat absorber that works as a base layer on which the thermistor film is formed and that absorbs radiant heat of infrared rays to be detected, and an electrode film that electrically connects the thermistor film to the wiring of first substrate 2 via second electric connection members 6 etc. (to be described). The thermistor film is formed of, for example, a metal film such as vanadium oxide (VOx), amorphous silicon (a-Si), nitride, or platinum. The radiant heat absorber is formed of, for example, silicon oxide (SiO₂), silicon nitride (SiN), aluminum oxide (Al₂O₃), or a combination thereof.

First electric connection members 5 are provided in first space 8a. First electric connection members 5 connect first substrate 2 to second substrate 3. First electric connection members 5 are conductors each having a circular cross section and a pillar shape and may be formed, for example, by plating. First electric connection members 5 have greater dimensions in the Z direction (are higher) than second electric connection members 6 (to be described) and therefore have larger cross sections than second electric connection members 6 from the viewpoint of ease of production. First electric connection members 5 include first row electric connection members 5a that are connected to row leads 10a on second substrate 3 (to be described) and first column electric connection members 5b that are connected to column leads 10b on second substrate 3 (to be described).

Each bolometer structure 7 is supported by second substrate 3 via a pair of second electric connection members 6. Second electric connection members 6 are also conductors each having a circular cross section and a pillar shape and may be formed, for example, by plating. A pair of second electric connection members 6 consists of second row electric connection member 6a that is connected to row lead 10a and second column electric connection member 6b that is connected to column lead 10b. Second row electric connection members 6a and second column electric connection members 6b extend downward in the Z direction toward first substrate 2 from row leads 10a and column leads 10b, respectively, and terminate between first substrate 2 and second substrate 3. Accordingly, bolometer structures 7 are suspended in first space 8a at a spacing from both first substrate 2 and second substrate 3 in the Z direction. Due to this arrangement, thermal influence upon bolometer structures 7 by elements provided in first substrate 2 can be mitigated. Second electric connection members 6 support bolometer structures 7 and supply a sensing current to bolometer structures 7.

Leads 10 are formed in second substrate 3. Leads 10 connect first electric connection members 5 to bolometer structures 7 and supply a sensing current to bolometer structures 7. Leads 10 are formed of a conductor such as copper. Leads 10 are formed for each row R and each column C of bolometer structures 7 and are formed in a lattice shape. Specifically, leads 10 consist of row leads 10a that extend in the row direction (first direction X) and column leads 10b that extend in the column direction (second direction Y). Row leads 10a connect first row electric connection members 5a to second row electric connection members 6a, and column leads 10b connect first column electric connection members 5b to second column electric connection members 6b. Row leads 10a sequentially connect to bolometer structures 7 that are contained in corresponding rows R, and column leads 10b sequentially connect to bolometer structures 7 that are contained in corresponding columns C. For the sake of convenience in FIG. 2, row lead 10a is shown separated at the portion facing bolometer structure 7, but row lead 10a actually extends continuously. The same applies to column leads 10b. Leads 10 extend between adjacent bolometer structures 7. Due to this arrangement, interference between leads 10 and bolometer structures 7 can be prevented, and influence upon bolometer structures 7 that is caused when leads 10 are heated by the radiant heat of infrared rays can be limited. Row leads 10a and column leads 10b extend at different positions in the Z direction with an insulating film (not illustrated) therebetween such that these leads may cross each other without being electrically connected to each other.

First row electric connection members 5a are alternately arranged first on one side and then on the other side of rows R of row leads 10a. In other words, first row electric connection members 5a are arranged on one side of every other row R of row leads 10a and on the other side of the remaining rows R. Similarly, first column electric connection members 5b are alternately arranged first on one side and then on the other side of columns C of column leads 10b. In other words, first column electric connection members 5b are arranged on one side of every other column C of column leads 10b and on the other side of the remaining columns C. Due to this arrangement, first electric connection members 5 of sufficient cross sections can be ensured while also limiting increase in the size of infrared sensor 1.

Infrared rays incident to infrared sensor 1 through second substrate 3 are incident to the array of bolometer structures 7. A sensing current sequentially flows through first row electric connection member 5a, row lead 10a, second row electric connection member 6a, selected bolometer structure 7, second column electric connection member 6b, column lead 10b, and first column electric connection member 5b. A change in the electric resistance of the thermistor film that is included in bolometer structure 7 is extracted as a change in voltage, and an electric signal (a voltage signal) is supplied to the ROIC of first substrate 2. The ROIC converts the voltage signal to brightness temperature. Selecting transistors (not illustrated) for selecting one bolometer structure 7 out of bolometer structures 7 are formed on second substrate 3. Bolometer structures 7 are sequentially selected by the selecting transistors, and changes in electric resistance that are extracted from selected bolometer structures 7 are sequentially converted into brightness temperatures. In this manner, all of bolometer structures 7 are scanned such that image data for one picture are obtained.

Measuring Elements

Infrared sensor 1 includes first measuring element 9a that is provided in first space 8a, second measuring element 9b that is provided in second space 8b and third measuring element 9c that is provided outside second space 8b. First measuring element 9a is an element used for taking a first measurement relating to first pressure P1, second measuring element 9b is an element used for taking a second measurement relating to second pressure P2, and third measuring element 9c is an element used for taking a third measurement relating to third pressure P3. Infrared sensor 1 includes monitoring portion 11 that obtains the first measurement that is taken using first measuring element 9a, the second measurement that is taken using second pressure measuring element 9b, and the third measurement (or reference measurement, to be described) that is taken using third measuring element 9c. For the sake of convenience, monitoring portion 11 is shown outside infrared sensor 1 in FIG. 1A but may alternatively be provided inside infrared sensor 1. The function of monitoring portion 11 will be described later. Monitoring portion 11 is made up from, for example, an arithmetic circuit and a memory. The arithmetic circuit includes, for example, a circuit for measuring electric resistance and a microprocessor, or alternatively, a circuit for measuring electric resistance and an op-amp.

First measuring element 9a may be at least one of bolometer structures 7. In other words, first measuring element 9a is used in common with at least one bolometer structure 7 out of bolometer structures 7. First measuring element 9a may also be used in common with some bolometer structures 7 out of bolometer structures 7. Infrared sensor 1 uses first measuring element 9a to take a first measurement relating to pressure based on a principle similar to a Pirani gauge or a Pirani vacuum gauge. In a Pirani gauge, a heated metal wire is suspended in a space to be measured and the electric resistance of the metal wire is measured. When gaseous molecules exist in the space to be measured, the gaseous molecules collide with the metal wire and thus lower the temperature of the metal wire. The degree of decrease in the temperature of the metal wire depends on the number of gaseous molecules, that is, the pressure in the space to be measured. The electric resistance of a metal decreases as the temperature decreases. Accordingly, the pressure in the space to be measured can be indirectly measured by measuring the electric resistance.

When an electric current is applied to supply electric power to bolometer structure 7 used as first measuring element 9, the thermistor film of bolometer structure 7 is mainly heated in accordance with the electric power, and the temperature of bolometer structure 7 increases compared to the temperature before the electric power is supplied. When electric power of a predetermined value is supplied to bolometer structure 7 for a predetermined time, the relationship between the number of gaseous molecules that exist in the space surrounding bolometer structure 7 and the increase in the temperature of bolometer structure 7 is as follows: When the number of gaseous molecules that exist in the space surrounding bolometer structure 7 is large, the degree of the increase in the temperature of bolometer structure 7 is small. When the number of gaseous molecules that exist in the space surrounding bolometer structure 7 is small, the degree of the increase in the temperature of bolometer structure 7 is large. This is because when the number of gaseous molecules that exist in the space surrounding bolometer structure 7 is large, a larger portion of the energy of the electric power that is supplied to bolometer structure 7 is distributed to the gaseous molecules. For this reason, an amount of change in temperature of bolometer structure 7 used as first measuring element 9a from before to after electric power of a predetermined value is supplied for a predetermined time depends on the pressure of the space surrounding bolometer structure 7. The amount of change in temperature of bolometer structure 7 is detected as an amount of change in the output of bolometer structure 7. Accordingly, the amount of change $\Delta V1$ in the output of bolometer structure 7 used as first measuring element 9a from before to after electric power of a predetermined value is supplied for a predetermined time depends on the pressure of the space surrounding bolometer structure 7 (pressure P1).

In this manner, according to a first method, infrared sensor 1 acquires as a first measurement the amount of change $\Delta V1$ in the output of bolometer structure 7 used as first measuring element 9a from before to after electric power of a predetermined value is supplied for a predetermined time. In addition, infrared sensor 1 can calculate first pressure P1 based on the amount of change $\Delta V1$ in the output (the first measurement) and the value of the supplied electric power in order to indirectly measure first pressure P1. For example, the same value of electric power that is supplied to bolometer structure 7 used as first measuring element 9a and the same time duration of supplying the electric power may be used for each measurement, and first pressure P1 can be thereby calculated based on the amount of change $\Delta V1$ in the output (the first measurement) of first measuring element 9a (bolometer structure 7), and first pressure P1 can thus be indirectly measured. The time duration of supplying electric power to bolometer structure 7 used as first measuring element 9a in the measurement may be a predetermined time that is sufficient for increasing the temperature of bolometer structure 7 to saturation, or may be a time that is not sufficient for increasing the temperature of bolometer structure 7 to saturation but that is predetermined.

The number of bolometer structures 7 used as first measuring elements 9a may be at least one and the locations of bolometer structures 7 are not particularly limited (the location of first measuring element 9a shown in FIG. 1B is merely an example). Thus, it is not necessary for infrared sensor 1 that uses bolometer structures 7 to separately include first measuring element 9a.

As a second method of calculating first pressure P1, third measuring element 9c that is provided outside second space 8b under a reference pressure (for example, under the atmospheric pressure) may be used as a reference measuring element. Third measuring element 9c may also have an arrangement that uses bolometer structure 7 as in first measuring element 9a. Third measuring element 9c is also provided on second substrate 3 but may alternatively be provided on first substrate 2 or second circumferential wall 4. Since third measuring element 9c is installed under atmospheric pressure, third measuring element 9c may be protected by a cover, as necessary, as long as a large pressure difference from atmospheric pressure is not produced.

An electric current is applied to supply electric power to bolometer structure 7 that is used as first measuring element 9a and bolometer structure 7 used as the reference measuring element (third measuring element 9c). The thermistor films of these bolometer structures 7 are mainly heated in accordance with the value of the electric power, and the temperature of bolometer structures 7 increases compared to the temperature before the electric power is supplied. After electric power of a predetermined value is supplied to bolometer structures 7 for a predetermined time, the relationship between first pressure P1 and the temperatures of each of first measuring element 9a and the reference measuring element (third measuring element 9c) is as follows: When first pressure P1 is lower than the reference pressure (the atmospheric pressure in this example), the temperature of first measuring element 9a rises above the temperature of the reference measuring element (third measuring element 9c) according to the difference between the first pressure P1 and the reference pressure. When first pressure P1 is higher than the reference pressure, the temperature of first measuring element 9a falls below the temperature of the reference measuring element (third measuring element 9c) according to the difference between the first pressure P1 and the reference pressure. The temperature of bolometer structure 7 is detected as the output value of bolometer structure 7. Accordingly, difference V1-V3 or ratio V1/V3 depends on first pressure P1, where V1 is the output value of first measuring element 9a and V3 is the output value of the reference measuring element (third measuring element 9c) after the above-mentioned predetermined electric power is supplied for a predetermined time.

As described above, according to the second method, infrared sensor 1 acquires output value V1 of first measuring element 9a as the first measurement and acquires output value V3 of the reference measuring element as the reference measurement after a predetermined electric power is supplied for a predetermined time to bolometer structure 7 used as first measuring element 9a and bolometer structure 7 used as the reference measuring element. In addition, infrared sensor 1 can calculate first pressure P1 based on output value V1 (the first measurement), output value V3 (the reference measurement), and the value of the supplied electric power, whereby first pressure P1 can be indirectly measured. For example, the same value of the electric power that is supplied to bolometer structure 7 used as first measuring element 9a and bolometer structure 7 used as the reference measuring element and the same time for supplying the electric power may be used for each measurement. Thus, first pressure P1 can be calculated based on output value V1 of first measuring element 9a (the first measurement) and output value V3 (the reference measurement), whereby first pressure P1 can be indirectly measured. The time duration of supplying electric power to bolometer structure 7 used as first measuring element 9a in the measurement may be a predetermined time that is sufficient for increasing the temperature of bolometer structure 7 to saturation, or may be a time that is not sufficient for increasing the temperature of bolometer structure 7 to saturation but that is predetermined.

Second measuring element 9b may also have an arrangement that uses bolometer structure 7. Second measuring element 9b is provided on second substrate 3. Since bolometer structures 7 are formed by wafer processes, bolometer structure 7 used as second measuring element 9b can be formed simultaneously with other bolometer structures 7. However, the location of second measuring element 9b is not particularly limited, and second measuring element 9b may be provided on any one of first substrate 2, first circumferential wall 4a, and second circumferential wall 4b, or may alternatively be suspended in second space 8b. The second measurement taken using second measuring element 9b may be acquired in the same manner as for first pressure P1 described above (in the same manner as in the first method or the second method), and second pressure P2 may be calculated based on at least the second measurement.

Second measuring element 9b also serves as blind cell 12. Infrared sensor 1 includes, in addition to above-mentioned bolometer structures 7 (active cells) that are arranged in a lattice, blind cell 12 that is used for temperature calibration of the output of bolometer structures 7. Blind cell 12 has the same arrangement as the active cells. Blind cell 12 receives radiation from surrounding structures, such as first substrate 2 and second substrate 3, in the same manner as the active cells, but does not receive radiation of infrared rays from the outside. For this reason, blind cell 12 is used as a calibration cell that removes background noise that is generated by any cause other than the radiation of infrared rays from the outside. Accordingly, blind cell 12 must be arranged so as not to receive the radiation of infrared rays from the outside. Since the portion of second substrate 3 that forms second space 8b has no light-incident portion, no structure for shielding infrared rays from the outside is required. In addition, since second measuring element 9b also serves as blind cell 12, it is not necessary to provide second measuring element 9b separately.

Second measuring element 9b may be provided so as not to be thermally separated from second substrate 3 (or first substrate 2 when it is provided on first substrate 2). Specifically, bolometer structure 7 that forms blind cell 12 is provided such that it is in contact with the surface of second substrate 3. When bolometer structure 7 that forms blind cell 12 that functions as second measuring element 9b is provided on first substrate 2, bolometer structure 7 that forms blind cell 12 is provided such that it is in contact with the surface of first substrate 2. This is because no heat-generating objects such as first electric connection members 5 are provided in second space 8b, and a bolometer structure in second space 8b is therefore less subject to thermal influence than bolometer structures 7 in first space 8a and therefore does not have to be suspended in second space 8b. However, from the viewpoint of the manufacturing processes, second measuring element 9b may alternatively be arranged such that it is thermally separated from second substrate 3 in the same manner as other bolometer structures 7.

Regarding third pressure P3, the third measurement taken using third measuring element 9c may be acquired and third pressure P3 may be calculated based on at least the third measurement in the same manner as the above-mentioned first method relating to first pressure P1.

Methods for Monitoring Pressure

Methods for monitoring the internal pressures of infrared sensor 1 using first to third measuring elements 9a to 9c and monitoring portion 11 will now be described. As described above, infrared sensor 1 may be used as part of a sensor system of an automobile. A sensor system relating to a safety function of an automobile must comply with ISO26262, and a vision system is often required to meet ASIL (Automotive Safety Integrity Level) Grade B. ASIL Grade B requires a self-diagnosis function, that is, a function for recognizing breakdown of a system after the system has failed. A failure predicting function may be further required when higher reliability of the system is required. Infrared sensor 1 of the present embodiment can meet the above-mentioned requirements using the methods next described.

Figure 3:
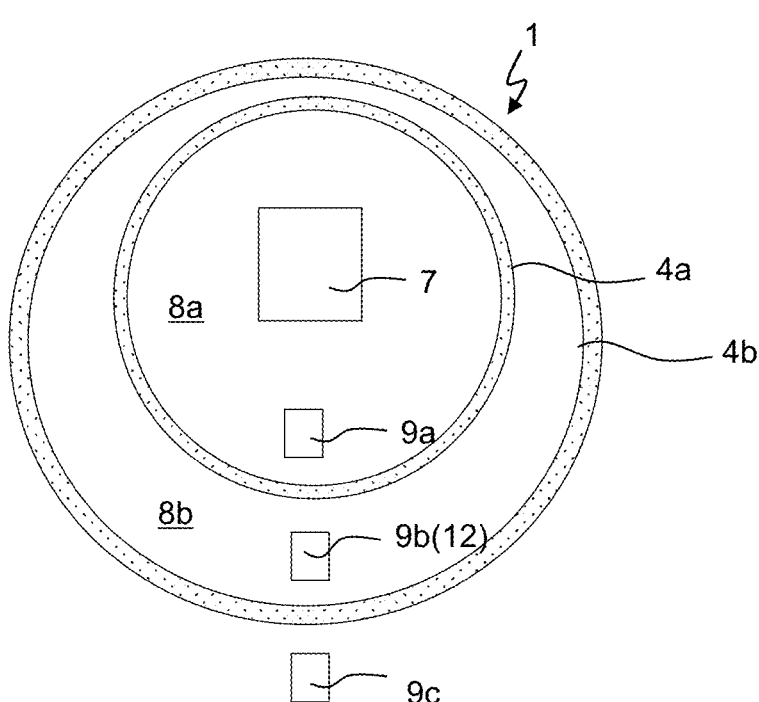
FIG. 3 is a conceptual view illustrating pressure classifications and the arrangement of measuring elements of the infrared sensor shown in FIGS. 1A to 1C.

FIG. 3 conceptually illustrates the classification of space of infrared sensor 1 and the arrangement of the measuring elements. FIG. 4A and FIGS. 4B to 4D illustrate the relationship between time and first to third pressures P1 to P3 in the normal condition and in abnormal conditions of infrared sensor 1. The term "abnormal" is a concept that refers both to a state in which the function of infrared sensor 1 has been lost (a state that is the object of the self-diagnosis function) and to a state in which the possibility of the loss of function has increased or any sign of loss of function has been recognized (a state that is the object of the failure predicting function).

In the following description, third pressure P3 is assumed to be the atmospheric pressure. However, third pressure P3 does not have to be equal to the atmospheric pressure as long as third pressure P3 is greater than first pressure P1 and second pressure P2 and does not fluctuate greatly. For example, third pressure P3 may be a pressure that is different from the atmospheric pressure depending on the environment in which infrared sensor 1 is installed. Monitoring portion 11 continuously or intermittently acquires (receives) the first to third measurements relating to first to third pressures P1 to P3 from first to third measuring elements 9a to 9c. Monitoring portion 11 outputs a predetermined signal indicating an abnormality based on at least the first measurement. The predetermined signal indicating an abnormality is, for example, a signal indicating an abnormality relating to at least either first pressure P1 or the pressure in a space outside first space 8a. When the first to third measurements are acquired intermittently, monitoring portion 11, for example, regularly applies an electric current to first to third measuring elements 9a to 9c and acquires and holds the first to third measurements. Monitoring portion 11 evaluates the trend of the first and second measurements, and upon judging based on the trend that the degree of increase in at least either first pressure P1 or second pressure P2 has exceeded a predetermined value, outputs a predetermined signal indicating an abnormality. The following explanation gives specific examples.

Figure 4A:
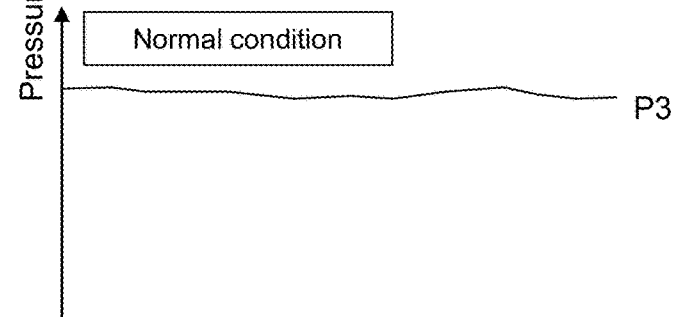
FIG. 4A is a diagram illustrating the normal mode of the infrared sensor.

Referring to FIG. 4A, infrared sensor 1 is in normal operation, and first pressure P1 and second pressure P2 are substantially the same and lower than third pressure P3. Third pressure P3 fluctuates slightly because it is the atmospheric pressure, but the fluctuation is not so large as to affect the method for monitoring the pressures in the present embodiment. Monitoring portion 11 acquires the first to third measurements from first to third measuring elements 9a to 9c and based on the first to third measurements judges that first to third pressures P1 to P3 are within the normal range. Monitoring portion 11 does not output any signal such as an alarm.

Figure 4B:
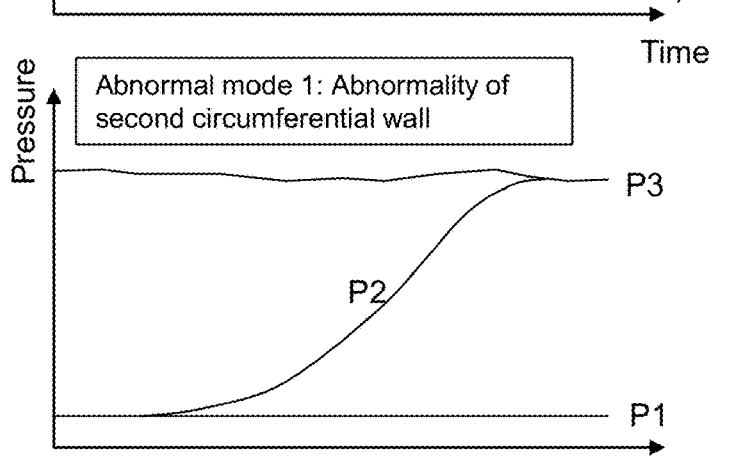
FIGS. 4B to 4D are diagrams illustrating abnormal modes of the infrared sensor.

Referring to FIG. 4B, second pressure P2 has increased and first pressure P1 remains at a normal value (abnormal mode 1). This phenomenon indicates that some leakage may have occurred in second circumferential wall 4b. Infrared sensor 1 is able to operate normally, but the function of infrared sensor 1 may be lost if any leakage occurs in first circumferential wall 4a. When monitoring portion 11 judges that second pressure P2 is substantially larger than first pressure P1 based on at least the first measurement and the second measurement, monitoring portion 11 outputs a predetermined alarm signal indicating an abnormality of second circumferential wall 4b. The alarm signal is sent, for example, to a control unit of the apparatus in which infrared sensor 1 is incorporated, and the user is notified of the alarm signal by an appropriate means such as a display on a screen of the apparatus or by a voice message. Alternatively, the alarm signal may only be stored in the control unit of the apparatus as log information without notifying the user.

For example, when the first method described above is used, second pressure P2 may be judged to be substantially larger than first pressure P1 by using difference ΔV1-ΔV2 or ratio ΔV1/ΔV2, where ΔV1 (the absolute value of the amount of change in output of first measuring element 9a) is the first measurement and ΔV2 (the absolute value of the amount of change in output of second measuring element 9b) is the second measurement. Taking into consideration the measurement error of first and second measurements ΔV1 and ΔV2, an alarm signal may be outputted when difference ΔV1-ΔV2 has exceeded a predetermined value or when ratio ΔV1/ΔV2 has exceeded a predetermined value that is larger than 1 (for example, 1.05 or 1.1). For example, when the second method described above is used, second pressure P2 may be judged to be substantially larger than first pressure P1 by using difference V1-V2 or ratio V1/V2, where V1 (the output value of first measuring element 9a) is the first measurement and V2 (the output value of second measuring element 9b) is the second measurement. When the outputs of first measuring element 9a and second measuring element 9b increase as the temperature increases, an alarm signal may be outputted when difference V1-V2 has exceeded a predetermined value or when ratio V1/V2 has exceeded a predetermined value that is larger than 1 (for example 1.05 or 1.1). When the outputs of first measuring element 9a and second measuring element 9b decrease as the temperature increases, an alarm signal may be outputted when difference V1-V2 has fallen below a predetermined value or when ratio ΔV1/ΔV2 has fallen below a predetermined value that is less than 1 (for example 0.95 or 0.9). The output of an alarm signal is not limited to one time, and more than one alarm signal may be outputted depending on the time at which difference P2-P1 or ratio P2/P1 is judged to have increased.

As an alternative method, monitoring portion 11 may output a predetermined alarm signal indicating an abnormality of second circumferential wall 4b upon judging that second pressure P2 has become close to third pressure P3 based on at least the second measurement and the third measurement. In this case, monitoring portion 11 judges that first pressure P1 is in the normal range based on the first measurement ΔV1 (the first method) or based on first measurement V1 and third measurement V3 (reference measurement V3) (the second method). For example, when the first method described above is used, second pressure P2 can be judged to have become close to third pressure P3 when the absolute value of difference ΔV3-ΔV2 tends to decrease or when ratio ΔV3/ΔV2 tends to approach 1, where ΔV2 (the absolute value of the amount of change in output of second measuring element 9b) is the second measurement and ΔV3 (the absolute value of the amount of change in output of third measuring element 9c) is the third measurement. For example, when the second method described above is used, second pressure P2 can be judged to have become close to third pressure P3 when the absolute value of difference V3-V2 tends to decrease or when ratio V3/V2 tends to approach 1, where V2 (the output value of second measuring element 9b) is the second measurement and V3 (the output value of third measuring element 9c) is the third measurement.

In addition, upon judging that second pressure P2 is substantially the same as third pressure P3 based on at least the second measurement and the third measurement, monitoring portion 11 may output a predetermined alarm signal indicating an abnormality of second circumferential wall 4b. For example, when the first method described above is used, second pressure P2 can be judged to be substantially the same as third pressure P3 when the absolute value of difference ΔV3-ΔV2 has fallen below a predetermined value or when the absolute value of the difference between ratio ΔV3/ΔV2 and 1 has fallen below a predetermined value. For example, when the second method described above is used, second pressure P2 can be judged to be substantially the same as third pressure P3 when the absolute value of difference V3-V2 has fallen below a predetermined value or when the absolute value of the difference between ratio V3/V2 and 1 has fallen below a predetermined value.

Figure 4C:
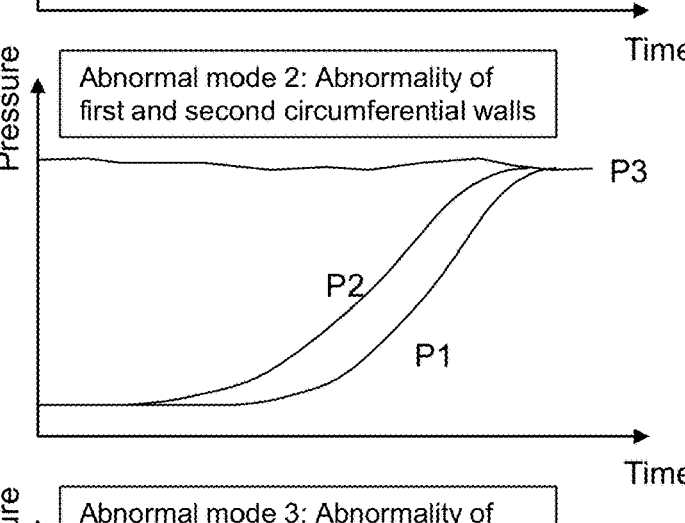

Referring to FIG. 4C, both first pressure P1 and second pressure P2 have increased (abnormal mode 2). This phenomenon indicates that some leakage has occurred in both first and second circumferential walls 4a and 4b. Since first pressure P1 has increased, infrared sensor 1 is highly unlikely to be able to operate normally. When monitoring portion 11 judges that pressure P1 is the same as or greater than a predetermined value based on at least the first measurement, monitoring portion 11 outputs a predetermined alarm signal indicating an abnormality. For example, when the first method described above is used, pressure P1 may be judged to be the same as or larger than the predetermined value by first measurement ΔV1 (the amount of change in output of first measuring element 9a). For example, when the second method described above is used, pressure P1 may be judged to be the same as or larger than the predetermined value by difference V1-V3 between first measurement V1 (the output value of first measuring element 9a) and reference measurement V3 (the output value of the reference measuring element (third measuring element 9c)) or by ratio V1/V3.

Since both first pressure P1 and second pressure P2 have increased in abnormal mode 2, monitoring portion 11 may alternatively output a predetermined alarm signal indicating an abnormality of first and second circumferential walls 4a and 4b upon judging that both first pressure P1 and second pressure P2 have increased based on at least the first measurement and the second measurement. For example, when the first method described above is used, both first pressure P1 and second pressure P2 may be judged to have increased by the temporal change in first measurement ΔV1 and the temporal change in second measurement ΔV2. For example, when the second method described above is used, both first pressure P1 and second pressure P2 may be judged to have increased both by difference V1-V3 between first measurement V1 (the output value of first measuring element 9a) and reference measurement V3 (the output value of the reference measuring element (third measuring element 9c)) or ratio V1/V3 and by difference V2-V3 between second measurement V2 (the output value of second measuring element 9b) and reference measurement V3 or ratio V2/V3.

In addition, upon judging that first pressure P1 and second pressure P2 are substantially the same as third pressure P3 based on at least the first measurement, the second measurement, and the third measurement, monitoring portion 11 may output a predetermined alarm signal indicating an abnormality of first and second circumferential walls 4a and 4b. For example, when the first method described above is used, first to third pressures P1 to P3 can be judged to be substantially the same both when the absolute value of difference ΔV1-ΔV3 between first measurement ΔV1 and third measurement ΔV3 or the absolute value of the difference between ratio ΔV1/ΔV3 and 1 has fallen below a predetermined value and when the absolute value of difference ΔV2-ΔV3 between second measurement ΔV2 and third measurement ΔV3 or the absolute value of the difference between ratio ΔV2/ΔV3 and 1 has fallen below a predetermined value.

For example, when the second method described above is used, first to third pressures P1 to P3 can be judged to be substantially the same both when the absolute value of difference V1-V3 between first measurement V1 and third measurement V3 or the absolute value of the difference between ratio V1/V3 and 1 has fallen below a predetermined value and when the absolute value of difference V2-V3 between second measurement V2 and third measurement V3 or the absolute value of the difference between ratio V2/V3 and 1 has fallen below a predetermined value.

Figure 4D:
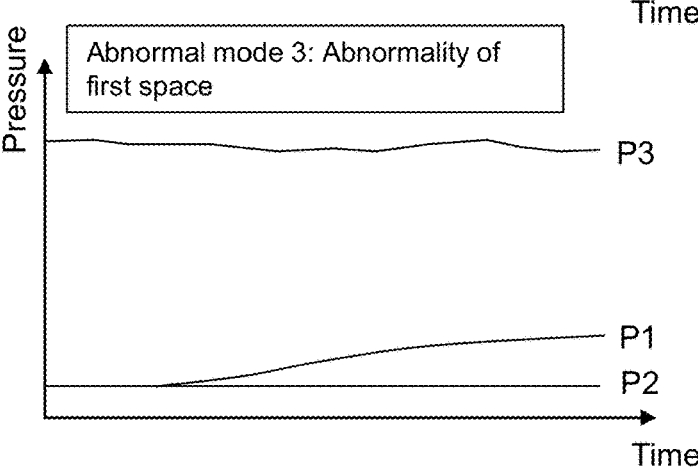
Figure 5:
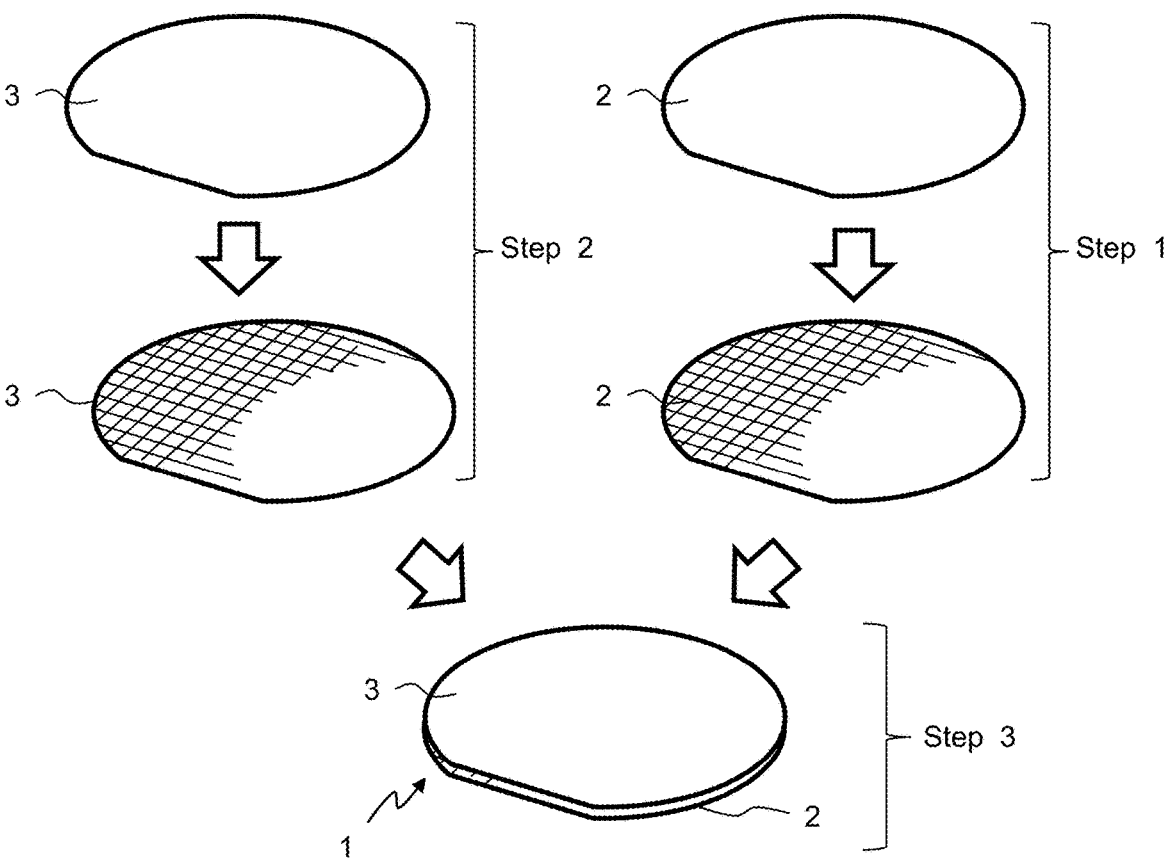
FIG. 5 is a conceptual view illustrating manufacturing steps of the infrared sensor.

Referring to FIG. 4D, first pressure P1 increases while second pressure P2 maintains the normal value (abnormal mode 3). This phenomenon indicates that some abnormality has occurred in first space 8a. The possibility that leakage has occurred in first or second circumferential wall 4a or 4b is low, but the operation of infrared sensor 1 will be affected. First space 8a may be provided with a film such as a getter film that absorbs residual gases in first space 8a in order to limit deterioration of the degree of vacuum in first space 8a. Gaseous molecules that may be released from such a film may increase first pressure P1. Upon judging that first pressure P1 is substantially larger than second pressure P2 based on at least the first measurement and the second measurement, monitoring portion 11 outputs a predetermined alarm signal indicating an abnormality of first space 8a. The judgment of whether first pressure P1 is substantially larger than second pressure P2 may be carried out in the same manner as the judgment regarding abnormal mode 1 except that the first measurement and the second measurement in the judgment for abnormal mode 1 are exchanged with each other. Alternatively, in the same manner as for abnormal mode 2, monitoring portion 11 may output a predetermined alarm signal indicating an abnormality upon judging that pressure P1 is the same as or larger than a predetermined value based on at least the first measurement.
Manufacturing Method An example of the method for manufacturing infrared sensor 1 of the present disclosure is next described. Since infrared sensor 1 is manufactured by wafer processes, first substrate 2 and second substrate 3 refer to wafers in the following descriptions. FIG. 5 conceptually illustrates the progression of the method for manufacturing infrared sensor 1. Infrared sensor 1 of the present disclosure is manufactured by: Step 1, in which elements such as ROICs are formed on first substrate 2; Step 2, in which bolometer structures 7 and the like are formed on second substrate 3; and Step 3, in which first substrate 2 and second substrate 3 are bonded together. Step 3 is carried out in a vacuum, and first pressure P1 and second pressure P2 are thereby set to be substantially the same. First electric connection members 5 and first and second circumferential walls 4a and 4b are formed on second substrate 3 in Step 2, and these elements 5, 4a, and 4b are bonded to first substrate 2 in Step 3.

First electric connection members 5 and first and second circumferential walls 4a and 4b are simultaneously formed by plating in Step 2. Specifically, columnar holes for forming first electric connection members 5 are formed in a solder mask, ring-shaped holes for forming first and second circumferential walls 4a and 4b are formed in the solder mask, and these elements 5, 4a, and 4b are simultaneously formed in these holes by plating. The heights (the dimensions in the Z direction) of first electric connection members 5 and first and second circumferential walls 4a and 4b after plating can be easily matched by setting thicknesses t1 to t3 of first electric connection members 5 and first and second circumferential walls 4a and 4b (see FIG. 1C) to be about the same.

Although an embodiment of the present disclosure has been described, the present invention is not limited to this embodiment. For example, third measuring element 9c may be omitted. Further, because third pressure P3 is the atmospheric pressure, a pressure or a voltage that corresponds to the standard atmospheric pressure (about 101.3 kPa) may be compared to first pressure P1 or second pressure P2. The number of circumferential walls 4a and 4b is not limited to two, and three or more circumferential walls may be concentrically provided. In this case, second measuring element 9b may be arranged in the space between any two adjacent circumferential walls. Providing three or more circumferential walls may be preferable both because the redundancy of the circumferential walls is enhanced and because the bonding strength of first substrate 2 and second substrate 3 is ensured.

Although a certain embodiment of the present disclosure has been shown and described in detail, it should be understood that various changes and modifications may be made without departing from the spirit or scope of the appended claims.

LIST OF REFERENCE NUMERALS

1 infrared sensor (electromagnetic wave sensor)
2 first substrate
3 second substrate
4a, 4b first and second circumferential walls
5 first electric connection member
7 bolometer structure
8a, 8b first and second spaces
9a to 9c first to third measuring elements
11 monitoring portion
12 blind cell

What is claimed is:

1. An electromagnetic wave sensor comprising:
a first substrate;
a second substrate that faces the first substrate and that allows infrared rays to pass through at least a part of the second substrate;
a first circumferential wall that is positioned between the first substrate and the second substrate and that forms a first space together with the first substrate and the second substrate;
a second circumferential wall that is positioned between the first substrate and the second substrate, that surrounds the first circumferential wall, and that forms a second space together with the first substrate and the second substrate and the first circumferential wall;
bolometer structures that are provided in the first space;
a first measuring element that is provided in the first space and that is used for taking a first measurement relating to pressure P1 in the first space;
a second measuring element that is provided in the second space and that is used for taking a second measurement relating to pressure P2 in the second space; and
a monitoring portion, wherein
the second measuring element is provided so as to be less thermally separated from the first substrate or the second substrate than the bolometer structures that are provided in the first space; and
the monitoring portion acquires the first measurement that is taken using the first measuring element and the second measurement that is taken using the second measuring element and outputs a predetermined signal indicating an abnormality based on at least the first measurement and the second measurement.

2. The electromagnetic wave sensor according to claim 1, wherein the first measurement is an amount of change in output value of the first measuring element from before to after a predetermined electric power is supplied to the first measuring element for a predetermined time.

3. The electromagnetic wave sensor according to claim 1, further comprising a reference measuring element that is provided outside the first space under a reference pressure, wherein:
the monitoring portion acquires an output value of the reference measuring element as a reference measurement after a predetermined electric power is supplied to the reference measuring element for a predetermined time,
the first measurement is an output value of the first measuring element after the predetermined electric power is supplied to the first measuring element for the predetermined time, and
the monitoring portion outputs the predetermined signal based on at least the first measurement and the reference measurement.

4. The electromagnetic wave sensor according to claim 1, wherein the first measuring element is at least one of the bolometer structures.

5. The electromagnetic wave sensor according to claim 1, wherein when the monitoring portion judges that the pressure P1 is greater than or equal to a predetermined value based on at least the first measurement, the monitoring portion outputs the predetermined signal.

6. The electromagnetic wave sensor according to claim 1, wherein the monitoring portion regularly supplies an electric current to the first measuring element in order to regularly acquire the first measurement, the monitoring portion holds the first measurement and evaluates a trend of the first measurement, and when the monitoring portion judges that a degree of increase in the pressure P1 has exceeded a predetermined degree based on the trend, the monitoring portion outputs the predetermined signal.

7. The electromagnetic wave sensor according to claim 1, wherein the second measuring element also serves as a blind cell.

8. The electromagnetic wave sensor according to claim 1, wherein when the monitoring portion judges that the pressure P2 is substantially larger than the pressure P1 based on at least the first measurement and the second measurement, the monitoring portion outputs the predetermined signal.

9. The electromagnetic wave sensor according to claim 1, wherein when the monitoring portion judges that the pressure P1 is substantially larger than the pressure P2 based on at least the first measurement and the second measurement, the monitoring portion outputs the predetermined signal.

10. The electromagnetic wave sensor according to claim 1, wherein when the monitoring portion judges that both the pressure P1 and the pressure P2 have increased based on at least the first measurement and the second measurement, the monitoring portion outputs the predetermined signal.

11. The electromagnetic wave sensor according to claim 1, further comprising a third measuring element that is provided outside the second space and that is used for taking a third measurement relating to pressure P3 outside the second space, wherein the monitoring portion acquires the third measurement that is taken using the third measuring element and outputs the predetermined signal based on at least the first measurement, the second measurement, and the third measurement.

12. The electromagnetic wave sensor according to claim 11, wherein when the monitoring portion judges that the pressure P2 has become close to the pressure P3 based on at least the second measurement and the third measurement, the monitoring portion outputs the predetermined signal.

13. The electromagnetic wave sensor according to claim 11, wherein when the monitoring portion judges that the pressure P2 is substantially equal to the pressure P3 based on at least the second measurement and the third measurement, the monitoring portion outputs the predetermined signal.

14. The electromagnetic wave sensor according to claim 11, wherein when the monitoring portion judges that the pressure P1 and the pressure P2 are substantially equal to the pressure P3 based on at least the first measurement, the second measurement, and the third measurement, the monitoring portion outputs the predetermined signal.

15. An electromagnetic wave sensor comprising:

a first substrate;

a second substrate that faces the first substrate and that allows infrared rays to pass through at least a part of the second substrate;

a first circumferential wall that is positioned between the first substrate and the second substrate and that forms a first space together with the first substrate and the second substrate;

a second circumferential wall that is positioned between the first substrate and the second substrate, that surrounds the first circumferential wall, and that forms a second space together with the first substrate and the second substrate and the first circumferential wall;

bolometer structures that are provided in the first space;

a first measuring element that is provided in the first space and that is used for taking a first measurement relating to pressure P1 in the first space;

a second measuring element that is provided in the second space and that is used for taking a second measurement relating to pressure P2 in the second space; and a monitoring portion, wherein the second measuring element is provided so as to be in contact with a surface of the first substrate or a surface of the second substrate; and the monitoring portion acquires the first measurement that is taken using the first measuring element and the second measurement that is taken using the second measuring element and outputs a predetermined signal indicating an abnormality based on at least the first measurement and the second measurement.

16. The electromagnetic wave sensor according to claim 15, wherein the second measuring element also serves as a blind cell.

17. The electromagnetic wave sensor according to claim 15, wherein when the monitoring portion judges that the pressure P2 is substantially larger than the pressure P1 based on at least the first measurement and the second measurement, the monitoring portion outputs the predetermined signal.

18. The electromagnetic wave sensor according to claim 15, wherein when the monitoring portion judges that the pressure P1 is substantially larger than the pressure P2 based on at least the first measurement and the second measurement, the monitoring portion outputs the predetermined signal.

19. The electromagnetic wave sensor according to claim 15, wherein when the monitoring portion judges that both the pressure P1 and the pressure P2 have increased based on at least the first measurement and the second measurement, the monitoring portion outputs the predetermined signal.

* * * * *